(12) United States Patent
Herrmann et al.

(10) Patent No.: US 9,812,792 B2
(45) Date of Patent: Nov. 7, 2017

(54) PRESSING ELEMENT, ELECTRICAL/ELECTRONIC COMPONENT

(71) Applicant: Robert Bosch GmbH, Stuttgart (DE)

(72) Inventors: Alexander Herrmann, Reutilingen (DE); Conrad Haeussermann, Trochtelfingen (DE); Wolfgang Woernle, Neustetten (DE); Benjamin Bertsch, Lichtenstein (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/916,894

(22) PCT Filed: Jul. 21, 2014

(86) PCT No.: PCT/EP2014/065626
§ 371 (c)(1),
(2) Date: Mar. 4, 2016

(87) PCT Pub. No.: WO2015/032538
PCT Pub. Date: Mar. 12, 2015

(65) Prior Publication Data
US 2016/0204525 A1    Jul. 14, 2016

(30) Foreign Application Priority Data

Sep. 5, 2013   (DE) .................. 10 2013 217 706

(51) Int. Cl.
*G01D 11/24*    (2006.01)
*H01R 13/24*    (2006.01)
(Continued)

(52) U.S. Cl.
CPC ............... *H01R 4/28* (2013.01); *H01R 4/60* (2013.01); *H01R 12/714* (2013.01);
(Continued)

(58) Field of Classification Search
CPC ............................ G01D 11/24; G01D 11/245
(Continued)

(56) References Cited

U.S. PATENT DOCUMENTS 5,947,269 A * 9/1999 Miyashita ............... H01H 13/48
200/406
6,108,211 A * 8/2000 Diessner .............. H01R 13/701
200/512

(Continued)

FOREIGN PATENT DOCUMENTS

CH     EP 2418666 A1 *  2/2012 ............. H01H 1/385
CN     102507336 A      6/2012
(Continued)

OTHER PUBLICATIONS

International Search Report corresponding to PCT Application No. PCT/EP2014/065626, dated Sep. 19, 2014 (German and English language document) (7 pages).

*Primary Examiner* — Lisa Caputo
*Assistant Examiner* — Jamel Williams
(74) *Attorney, Agent, or Firm* — Maginot, Moore & Beck LLP

(57) ABSTRACT

A pressing element is configured for an electrical component which needs to be pressed against another element for contact. The electrical component includes at least one electrically conductive touch contact. The pressing element has an annular pressing surface for the electrical component. An outer contour of the pressing surface is greater than an outer contour of the electrical component which needs to be pressed. The pressing surface has an annular elevation which forms a bearing surface for the electrical component.

18 Claims, 4 Drawing Sheets

(51) Int. Cl.
  *H01R 4/60*   (2006.01)
  *H01R 4/28*   (2006.01)
  *H01R 12/71*  (2011.01)
  *H05K 5/00*   (2006.01)
(52) U.S. Cl.
  CPC ......... *H05K 5/0078* (2013.01); *G01D 11/245* (2013.01); *H01R 13/24* (2013.01)
(58) Field of Classification Search
  USPC .......................................................... 73/756
  See application file for complete search history.

(56) References Cited

U.S. PATENT DOCUMENTS

| | | | | | |
|---|---|---|---|---|---|
| 6,470,739 | B1* | 10/2002 | Matsumura | ........... | G01L 19/003 |
| | | | | | 73/114.37 |
| 2006/0032286 | A1* | 2/2006 | Magane | .................. | G01H 5/00 |
| | | | | | 73/1.82 |
| 2007/0012087 | A1* | 1/2007 | Ruth | .................... | G01N 27/407 |
| | | | | | 73/31.01 |
| 2008/0000765 | A1* | 1/2008 | Ho | ........................ | H01H 13/14 |
| | | | | | 200/341 |
| 2014/0137656 | A1* | 5/2014 | Henzler | ................ | G01D 11/245 |
| | | | | | 73/756 |
| 2014/0191962 | A1* | 7/2014 | Kim | .................... | G06F 3/03547 |
| | | | | | 345/157 |
| 2016/0128208 | A1* | 5/2016 | Bolik | ................... | H05K 5/0069 |
| | | | | | 361/709 |
| 2016/0299027 | A1* | 10/2016 | Klopf | .................... | B23K 31/02 |

FOREIGN PATENT DOCUMENTS

| | | | | |
|---|---|---|---|---|
| DE | WO 2007051491 A1 * | 5/2007 | ........ | B01L 3/502715 |
| DE | 10 2012 003 979 B3 | 6/2013 | | |
| DE | 102012003979 B3 * | 6/2013 | .......... | H01M 2/1077 |
| DE | WO 2013127485 A1 * | 9/2013 | .......... | H01M 2/1077 |
| EP | 2 418 666 A1 | 2/2012 | | |
| JP | WO 2013031204 A1 * | 3/2013 | ................ | H01R 4/20 |
| WO | 2007/051491 A1 | 5/2007 | | |
| WO | 2013/031204 A1 | 3/2013 | | |

* cited by examiner

PRESSING ELEMENT, ELECTRICAL/ELECTRONIC COMPONENT

This application is a 35 U.S.C. §371 National Stage Application of PCT/EP2014/065626, filed on Jul. 21, 2014, which claims the benefit of priority to Serial No. DE 10 2013 217 706.2, filed on Sep. 5, 2013 in Germany, the disclosures of which are incorporated herein by reference in their entirety.

The disclosure relates to a pressing element for an electrical structural element which is to be pressed in order for contact to be made and which has at least one electrically conductive touch contact, wherein the pressing element has an annular pressing surface for the structural element, and wherein an outer contour of the pressing surface is larger than an outer contour of the structural element which is to be pressed.

The disclosure further relates to an electrical/electronic component, in particular sensor component, having an, in particular, multipartite housing and having at least one electrical structural element, in particular sensor element, which has at least one electrically conductive touch contact, and having a pressing element which is associated with that side of the structural element which is averted from the touch contact and is held in the housing such that it is prestressed against the structural element.

BACKGROUND

Pressing elements and components of the kind cited in the introductory part are known from the prior art.

In order to make contact with electrical structural elements, it is known to also provide, in addition to interlocking plug connections, electrical connections which are realized only by a touch contact. To this end, the electrical structural element is pushed or pressed by way of a touch contact against a mating touch contact in order to permanently ensure electrical contact. In this case, the pressing or contact-pressure force necessary for this purpose is often generated by an elastically deformable pressing element which is inserted into the housing and is held in a prestressed manner, for example, between the structural element and the housing. In this case, the pressing element often also serves as a sealing element at the same time, for example in a pressure sensor in order to firstly expose the sensor to the pressure which is to be detected and secondly to protect sensitive regions of the sensor from the medium which provides the pressure. Therefore, the pressing element is of annular design. For reasons of cost, the structural element should in most cases be designed to be as small as possible, while at the same time the dimensions of the pressing element cannot be reduced in size as desired for technological reasons. In conjunction with the manufacturing tolerances which also have to be taken into account, this leads to it not always being possible to ensure that the structural element bears on the pressing element with its full surface. With an annular pressing surface, the structural element may slip off from the pressing element owing to the deformation of the pressing element.

SUMMARY

The pressing element according to the disclosure has the advantage that the structural element is prevented from slipping off in this way in a simple manner. This is achieved by special shaping of the pressing element, this shaping preventing corresponding deformation of the pressing element. In this case, it is provided, according to the disclosure, that the pressing surface has an annular raised portion which forms a bearing surface for the structural element. Therefore, the pressing element has an annular raised portion which is raised in relation to the rest of the pressing surface. As a result, regions with different material thicknesses are realized on the pressing element, this making it difficult to deform the pressing element in regions, so that the deformation is introduced into the pressing element more effectively in the case of a structural element which bears only partially on the pressing surface, so that the deformation cannot lead to the structural element slipping off.

According to one advantageous development of the disclosure, it is provided that the pressing element is of annular design. In this case, the pressing element is therefore of annular design overall, so that it has an aperture or a clear width, and has, on one side, the pressing surface and the bearing surface by way of which it acts or can act on the structural element. The bearing surface expediently extends coaxially in relation to the ring shape of the pressing element. In this case, the ring shape can be in the form of a circular ring, an oval ring or else a polygonal ring, in particular in the form of a square. The important factor is that the pressing element forms a closed ring. Owing to the completely annular design, the pressing element can be positioned, for example, directly above a sensor part of the structural element with the aperture and clamped in between a housing flange and the structural element, so that the sensor part is connected, for example, to the area surrounding the housing by the housing flange, while the rest of the structural element is protected.

According to a preferred development of the disclosure, it is provided that the pressing surface extends radially from a casing inner wall to a casing outer wall of the annular pressing element. In this context, radial is intended to be understood to mean substantially in the first instance only an extension from the inside to the outside starting from a center point of the pressing element. It goes without saying that the pressing surface extends exactly radially only in the case of a pressing element which is in the form of a circular ring.

Furthermore, it is preferably provided that the casing inner wall extends axially as far as the pressing surface, so as to form the raised portion at the same time. Therefore, the raised portion adjoins the inside of the casing inner wall, wherein said raised portion extends outward above the pressing surface only in regions, so that a circumferential region of the original pressing surface is retained. The effect of this is that, when the pressing element is pressed against the structural element, the structural element does not enter the pressing element or the material of the pressing element or does not enter said pressing element or said material of the pressing element to a great extent, so that a lower force acts laterally on the structural element as a result of the deformation of possibly projecting material of the pressing element.

According to a preferred development of the disclosure, it is provided that the casing inner wall is oriented obliquely with respect to the bearing surface and/or the pressing surface. Owing to an oblique design of the casing inner wall, force is introduced into the pressing element such that buckling of the casing inner wall is avoided.

In particular, it is preferably provided that the casing inner wall is oriented obliquely in such a way that the clear width of the annular pressing element decreases starting from the bearing surface. This provides a particularly stable pressing element which reliably carries or supports the structural element.

Furthermore, it is preferably provided that the pressing element is manufactured from silicone or from a thermoplastic elastomer. This provides the pressing element with an advantageous degree of flexibility and ensures a long service life.

The electrical/electronic component according to the disclosure is distinguished by the pressing element according to the disclosure. This results in the abovementioned advantages.

The housing preferably has at least two housing parts, wherein the pressing element and the structural element are held in a prestressed manner between the two housing parts by the pressing element. Therefore, the pressing element and the structural element are held braced between the two housing parts, so that additional holding means are not required. The pressing element is particularly preferably arranged in the region of a connection piece of one of the housing parts and is of annular design overall.

Another of the housing parts particularly preferably has at least one mating touch contact against which the electrical structural element is pushed by the pressing element. The structural element is therefore permanently connected to the mating touch contact element by means of the pressing element, such that they are in electrical touch contact, when the housing parts are put together.

BRIEF DESCRIPTION OF THE DRAWINGS

The disclosure will be explained in greater detail below with reference to an exemplary embodiment. To this end.

DETAILED DESCRIPTION

Figure 1:
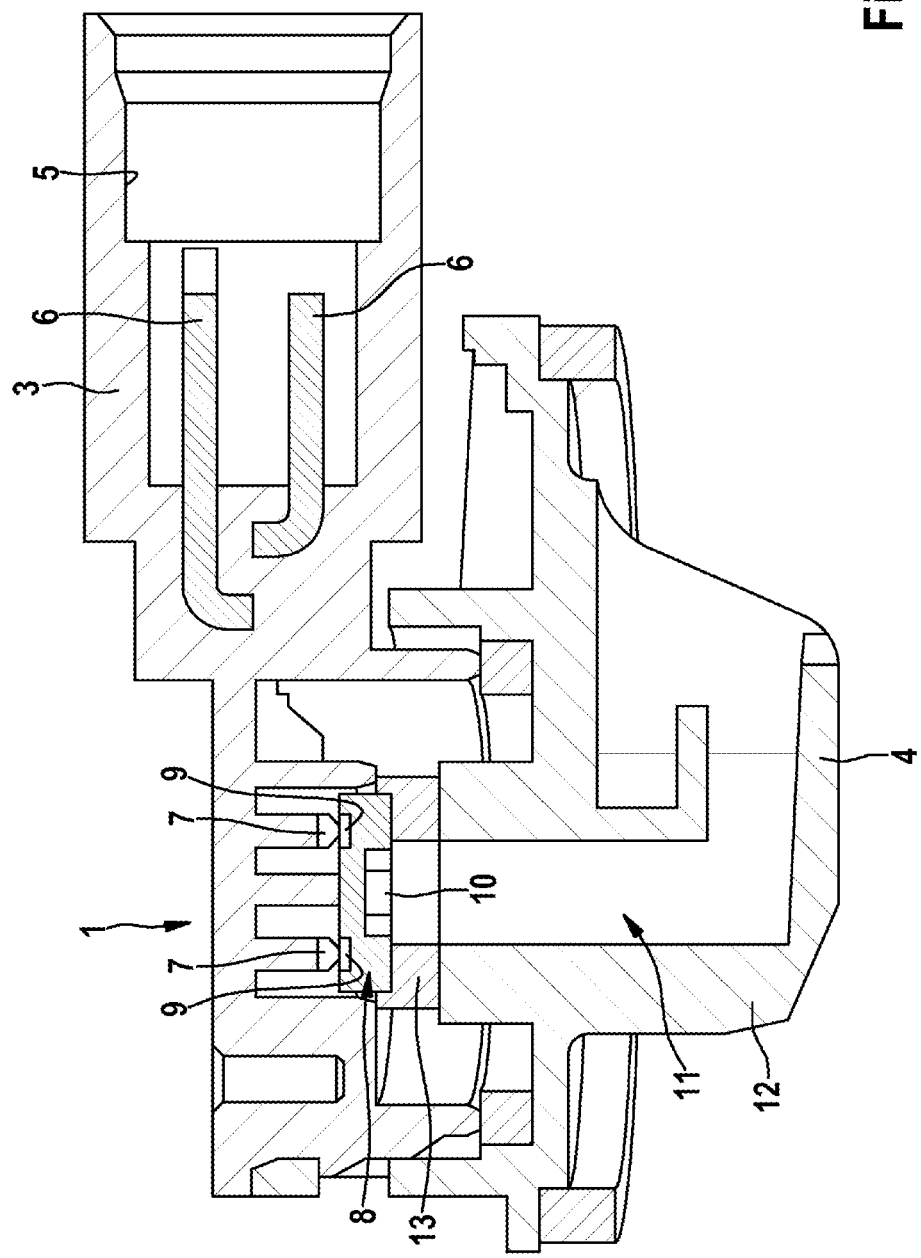
FIG. 1 shows a sectional illustration of a component having an electrical structural element.

FIG. 1 shows a sectional illustration through an electrical component 1 which is in the form of a sensor component. The component 1 has a multipartite housing 2 which is formed by two housing parts 3, 4 which are arranged in relation to one another so as to enclose a space in a sealed manner.

The first housing part 3 is in the form of a connection part and, to this end, has a plug receptacle 5 into which electrical contact pins 6 project. The contact pins 6 are electrically connected to mating touch contacts 7 which face the space. An electrical structural element 8, which is in the form of a sensor element in the present case, bears against the mating touch contacts 7 by way of in each case corresponding touch contacts 9 in order to establish an electrical connection to the contact pins 6.

The structural element 8 has, on its side which is situated opposite the touch contacts 8, a sensor 10 which is in the form of a pressure sensor.

The housing part 4 has a channel 11 which leads through a connection piece 12 from the enclosed space into the surrounding area. In this case, the two housing parts 3 and 4 are arranged in relation to one another in such a way that the channel 11 ends opposite the sensor 10.

Furthermore, an elastically deformable pressing element 13 which is manufactured from a plastic material, in particular from silicone or from a thermoplastic elastomer, is provided between the housing part 4 and the structural element 8.

Figure 2:
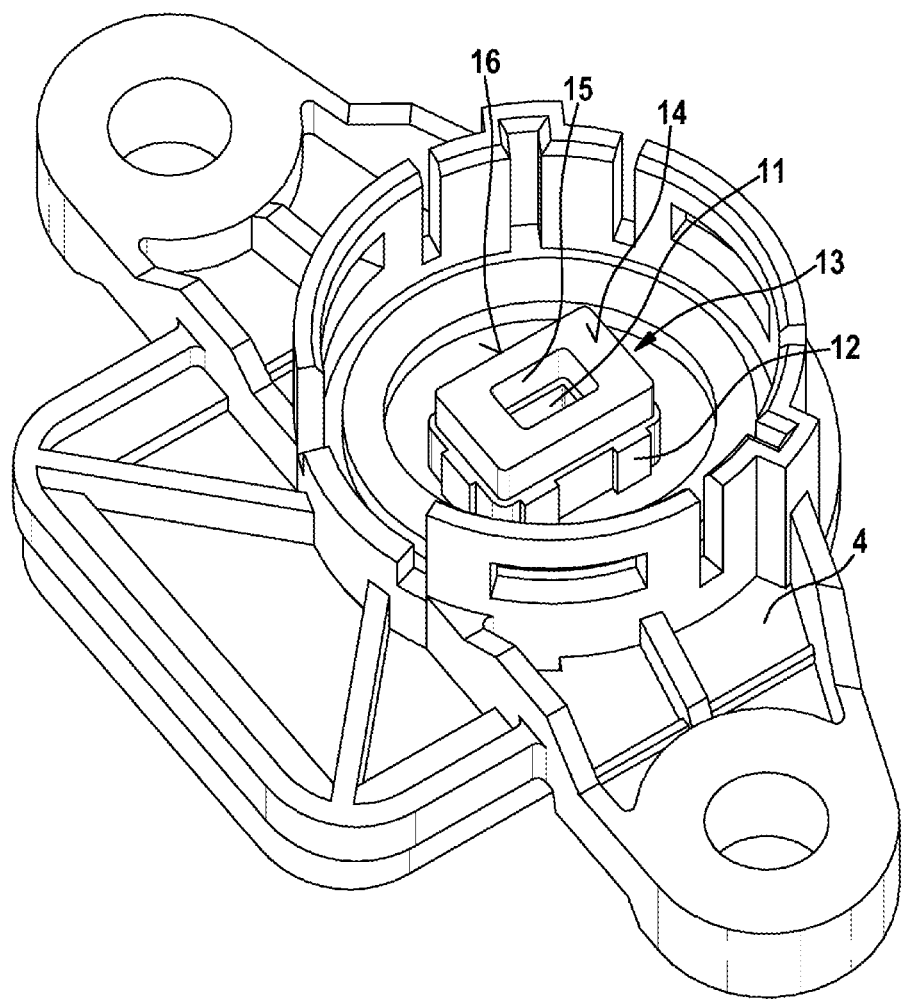
FIG. 2 shows a perspective plan view of a housing part of the component.

FIG. 2 shows a perspective plan view of the housing part 4 and the pressing element 13 which is arranged on it. The pressing element 13 rests on the free end of the connection piece 12 and is of annular design, so that it continues to guide the channel 11. In the present case, the channel 11 and the spring element 13 have a rectangular contour. The pressing surface 14, which faces the structural element 8, of the pressing element 13 is of flat design in the present case. In this case, the pressing surface 14 extends from a casing inner wall 15 as far as a casing outer wall 16, which walls are oriented parallel in relation to one another and perpendicular in relation to the pressing surface 14. This embodiment of the pressing element 13 corresponds to a known embodiment. Since the inner dimensions of the pressing element 13 cannot be reduced in size in any desired manner for technological reasons, and in conjunction with manufacturing tolerances, it is necessary for the casing outer wall to have a contour which projects beyond the outer contour of the structural element 8, so that the structural element 8 rests on the pressing surface 14 of the pressing element 13 only in regions, as shown in FIG. 3.

Figure 3:
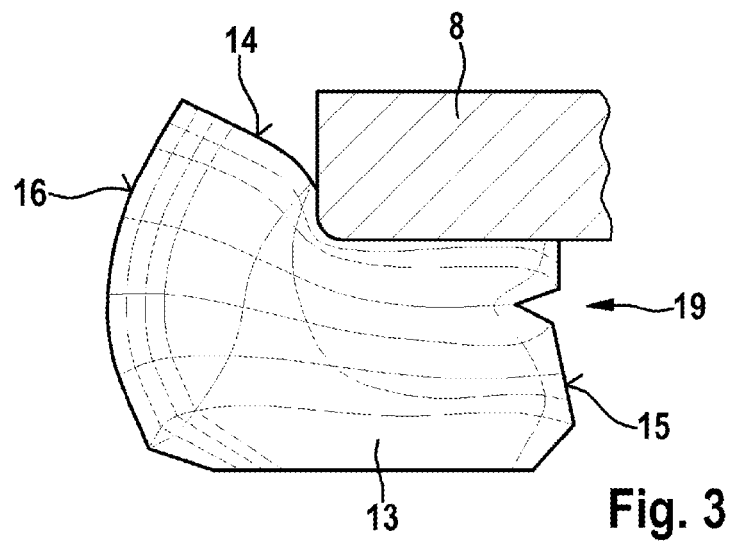
FIG. 3 shows an enlarged sectional illustration through the component.

In the assembled state, the structural element 8 is, as shown in a schematic sectional illustration in FIG. 3, pressed into the material of the annular pressing element 13, as a result of which the deformation illustrated in FIG. 3 arises. In this respect, the pressing element 13 acts as a sealing element which continues to guide the channel 11 to the sensor 10, without the further elements of the component 1 coming into contact with the medium which is carried by the channel 11. As a result, the electrical/electronic elements of the component 1 can be reliably protected against external influences, in particular against soiling.

If the structural element 8, as illustrated, enters the material of the pressing part 13, a lateral force F, which acts laterally on the structural element 8 and can lead to said structural element 8 sliding off the pressing element 13, is produced in addition to the pressing force.

Figure 4:
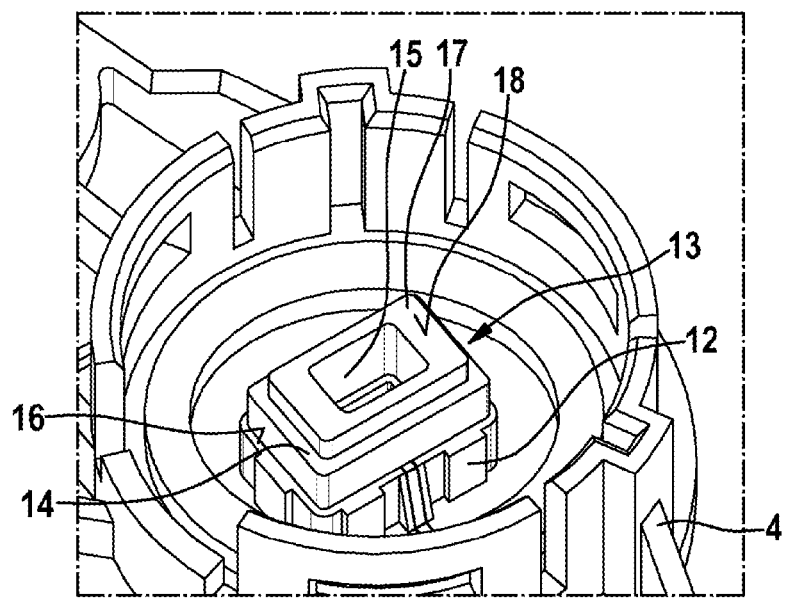
FIG. 4 shows a perspective plan view of an advantageous pressing element of the component.
Figure 5:
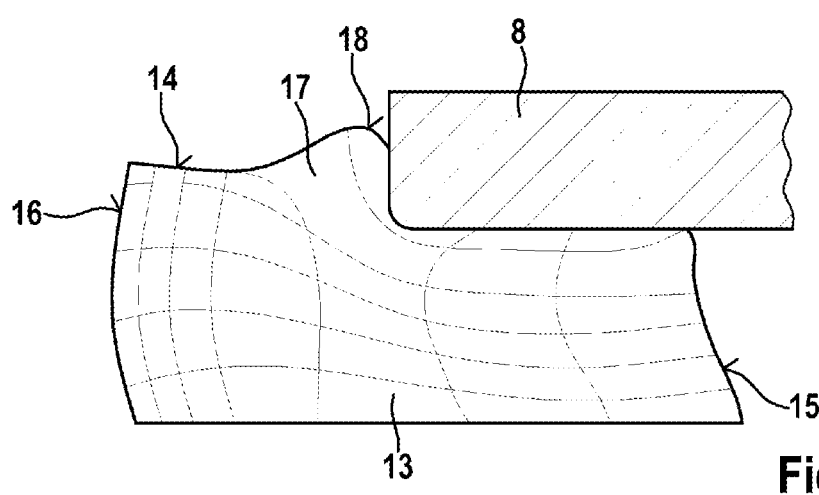
FIG. 5 shows a schematic sectional illustration through the component having the advantageous pressing element.

In order to avoid this, an embodiment of the pressing element 13 as is shown in FIGS. 4 and 5 is proposed. In this case, it is provided that the pressing surface has an annular raised portion 17 which forms a bearing surface 18 for the structural element 8. The annular raised portion 17 adjoins the casing inner wall and extends over the pressing surface 14 only in sections, so that a circumferential region of the original pressing surface 14 is retained. This produces a step on the pressing surface 14 of the pressing element 13. The outer contour of the raised portion 17 preferably extends at most only slightly beyond the outer contour of the structural element 8, so that no lateral forces or only very slight lateral forces are produced on the structural element 8 in the assembled state of the component 1. If the component 1 is now, given constant dimensions of the structural element 8, joined as described above, so that the pressing element is pushed against the structural element 8, the pressing element 13 is deformed, as is shown in a schematic illustration in FIG. 5.

The annular raised portion 17 results in a deformation of the pressing element 13, in the case of which deformation the lateral force, which is produced owing to the structural element 8 entering the material of the pressing element 13, turns out to be much lower than the previously described example.

In addition, it is also provided according to the exemplary embodiment of FIG. 5 that the casing inner wall 15 is of oblique design. In this case, the casing inner wall 15 runs obliquely with respect to the casing outer wall 16 and the pressing surface 14. This prevents the pressing element 13 from buckling in the event of a high degree of loading on the casing inner wall 15, as is the case at the point marked by arrow 19 in FIG. 3.

The step-like design of the pressing surface 14 means that, when the pressing element 13 is pressed, the lateral swelling of plastic material and therefore the resulting lateral shear forces which act on the structural element 8 are reduced. Furthermore, buckling of the casing inner wall 15 is prevented by the oblique orientation of the casing inner wall 15 of the pressing element 13.

The invention claimed is:

1. An electrical/electronic component comprising,
a housing;
at least one electrical structural element, including at least one electrically conductive touch contact, and
a pressing element associated with a side of the at least one electrical structural element averted from the at least one electrically conductive touch contact, the pressing element held in the housing so as to be prestressed against the at least one electrical structural element,
wherein:
the pressing element includes an annular pressing surface configured to contact the at least one electrical structural element,
an outer contour of the annular pressing surface is larger than an outer contour of the at least one electrical structural element, and
the annular pressing surface has an annular raised portion configured as a bearing surface for the at least one electrical structural element;
the housing has at least two housing parts;
the at least one electrical structural element is held in a prestressed manner between the at least two housing parts via interposition of the pressing element; and
one of the at least two housing parts includes a mating touch contact against which the at least one electrical structural element is pushed by way of the at least one electrically conductive touch contact by the pressing element.

2. The component as claimed in claim 1, wherein the pressing element has an annular configuration.

3. The component as claimed in claim 2, wherein the annular pressing surface extends from a casing inner wall to a casing outer wall of the pressing element.

4. The component as claimed in claim 3, wherein the casing inner wall extends axially as far as the bearing surface to form the annular raised portion.

5. The component as claimed in claim 3, wherein the casing inner wall is oriented obliquely with respect to at least one of the bearing surface and the annular pressing surface.

6. The component as claimed in claim 3, wherein the casing inner wall is oriented obliquely such that a clear width of the pressing element decreases starting from the bearing surface.

7. The component as claimed in claim 1, wherein the pressing element is manufactured from one of silicone and a thermoplastic elastomer.

8. The component as claimed in claim 1, wherein the component is a sensor component.

9. The component as claimed in claim 1, wherein the at least one electrical structural element is a sensor element.

10. An electrical/electronic component comprising,
a housing;
at least one electrical structural element, including at least one electrically conductive touch contact, and
a pressing element associated with a side of the at least one electrical structural element averted from the at least one electrically conductive touch contact, the pressing element held in the housing so as to be prestressed against the at least one electrical structural element,
wherein:
the pressing element includes an annular pressing surface configured to contact the at least one electrical structural element,
an outer contour of the annular pressing surface is larger than an outer contour of the at least one electrical structural element, and
the annular pressing surface has an annular raised portion configured as a bearing surface for the at least one electrical structural element;
the at least one electrical structural element is a sensor element.

11. The component as claimed in claim 10, wherein the pressing element has an annular configuration.

12. The component as claimed in claim 11, wherein the annular pressing surface extends from a casing inner wall to a casing outer wall of the pressing element.

13. The component as claimed in claim 12, wherein the casing inner wall extends axially as far as the bearing surface to form the annular raised portion.

14. The component as claimed in claim 12, wherein the casing inner wall is oriented obliquely with respect to at least one of the bearing surface and the annular pressing surface.

15. The component as claimed in claim 12, wherein the casing inner wall is oriented obliquely such that a clear width of the pressing element decreases starting from the bearing surface.

16. The component as claimed in claim 10, wherein the pressing element is manufactured from one of silicone and a thermoplastic elastomer.

17. The component as claimed in claim 10, wherein:
the housing has at least two housing parts, and
the at least one electrical structural element is held in a prestressed manner between the at least two housing parts via interposition of the pressing element.

18. An electrical/electronic component comprising,
a housing that includes a mating touch contact;
at least one electrical structural element, including at least one electrically conductive touch contact, and
a pressing element associated with a side of the at least one electrical structural element averted from the at least one electrically conductive touch contact, the pressing element held in the housing so as to be prestressed against the at least one electrical structural element,
wherein:
the pressing element includes an annular pressing surface configured to contact the at least one electrical structural element,
an outer contour of the annular pressing surface is larger than an outer contour of the at least one electrical structural element, the annular pressing surface has an annular raised portion configured as a bearing surface for the at least one electrical structural element; and the pressing element is configured such that the prestress of the pressing element causes the pressing element to push the at least one electrically conductive touch contact of the at least one electrical structural element into electrical contact with the mating touch contact of the housing.

* * * * *